(12) United States Patent
Behnke et al.

(10) Patent No.: US 9,217,206 B2
(45) Date of Patent: Dec. 22, 2015

(54) ENHANCED POROSIFICATION

(71) Applicants: Joseph Behnke, San Jose, CA (US);
Seung Bum Rim, Palo Alto, CA (US)

(72) Inventors: Joseph Behnke, San Jose, CA (US);
Seung Bum Rim, Palo Alto, CA (US)

(73) Assignee: SunPower Corporation, San Jose, CA (US)

( * ) Notice: Subject to any disclaimer, the term of this patent is extended or adjusted under 35 U.S.C. 154(b) by 163 days.

(21) Appl. No.: 14/040,116

(22) Filed: Sep. 27, 2013

(65) Prior Publication Data
US 2015/0090606 A1 Apr. 2, 2015

(51) Int. Cl.
*C25F 3/12* (2006.01)
*C25F 3/30* (2006.01)
*C25F 7/00* (2006.01)
*H01L 31/18* (2006.01)
*H01L 21/02* (2006.01)
*H01L 31/068* (2012.01)

(52) U.S. Cl.
CPC ...... *C25F 3/30* (2013.01); *C25F 3/12* (2013.01); *C25F 7/00* (2013.01); *H01L 21/0203* (2013.01); *H01L 31/0682* (2013.01); *H01L 31/1804* (2013.01); *H01L 31/1892* (2013.01)

(58) Field of Classification Search
CPC .................. C25F 3/12; C25F 3/30; C25F 7/00
USPC ........................................................ 205/640
See application file for complete search history.

(56) References Cited

U.S. PATENT DOCUMENTS

| 6,726,815 | B1 * | 4/2004 | Artmann et al. | 204/267 |
| 8,540,862 | B2 * | 9/2013 | Jeon et al. | 205/666 |
| 8,926,803 | B2 | 1/2015 | Crafts et al. | |
| 2005/0150776 | A1 * | 7/2005 | Murakami et al. | 205/652 |
| 2008/0179180 | A1 * | 7/2008 | McHugh et al. | 204/164 |

FOREIGN PATENT DOCUMENTS

| JP | 10079524 | 3/1998 |
| JP | 11214725 | 8/1999 |
| JP | 2000223725 | 8/2000 |
| JP | 2000332270 | 11/2000 |

OTHER PUBLICATIONS

International Search Report and Written Opinion from PCT/US2014/056415 mailed Dec. 31, 2014, 9 pgs.

* cited by examiner

*Primary Examiner* — Nicholas A Smith
(74) *Attorney, Agent, or Firm* — Blakely Sokoloff Taylor Zafman LLP

(57) ABSTRACT

Forming a porous layer on a silicon substrate. Forming the porous layer can include placing a first silicon substrate in a solution, where a first electrode is within a threshold distance to an edge of the silicon substrate. It can further include conducting a first current through the silicon substrate, where the first electrode can be positioned relative to the edge allowing for substantially uniform porosification along the edge of the first silicon substrate.

19 Claims, 7 Drawing Sheets

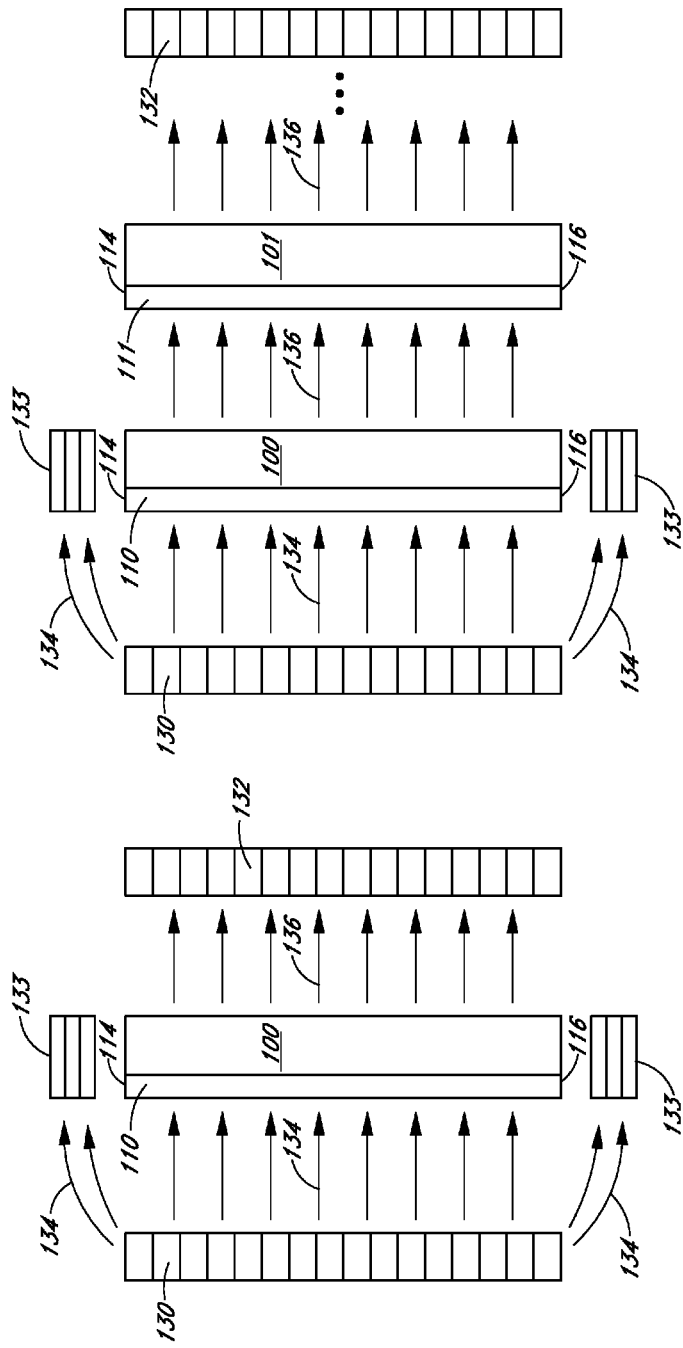

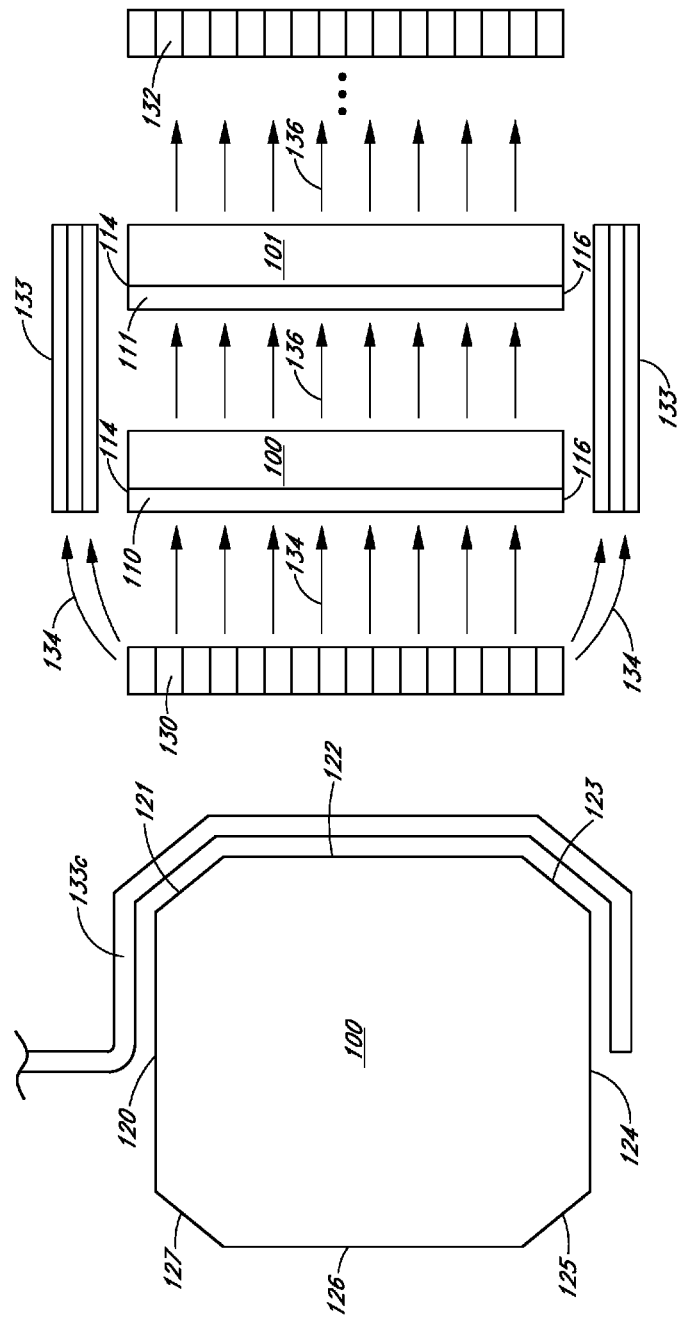

ENHANCED POROSIFICATION

TECHNICAL FIELD

Embodiments of the subject matter described herein relate generally to semiconductors, silicon substrates and solar cells. More particularly, embodiments of the subject matter relate to semiconductors, solar cells and fabrication processes.

BACKGROUND

Semiconductors and silicon-based substrates are well known devices widely used in the semiconductor and electronics industry for various applications and devices. As an example, solar cells, a type of semiconductor type device, are well known devices for converting solar radiation to electrical energy. They can be fabricated on a semiconductor wafer using semiconductor processing technology. A photovoltaic cell or a solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact regions and contact fingers allow an external electrical circuit to be coupled to and be powered by the solar cell. One or more embodiments pertain to photovoltaic cells or solar cells and photovoltaic fabrication processes. Such processes can include processing silicon substrates in preparation for subsequent solar cell processes as described below.

BRIEF SUMMARY

A method for forming a porous layer on a silicon substrate is disclosed. The method can include placing a first silicon substrate in a solution, where a first electrode is within a threshold distance of a first edge of the first silicon substrate. The method can further include conducting a first current through the first silicon substrate, where placement of the first electrode within the threshold distance of the first edge allows for substantially uniform porosification along the first edge of the first silicon substrate. The method can also include placing of the first electrode within a threshold distance (same or different) of a second edge of the first silicon substrate allowing for substantially uniform porosification along the second edge of the first silicon substrate.

Another method of forming a porous layer on a silicon substrate is disclosed. The method can include placing a first silicon substrate in a solution, the first silicon substrate positioned between a second and third electrode, where a first electrode is positioned along a first perimeter edge of the first silicon substrate. The method can further include conducting a first current from the second electrode to the third electrode through the first silicon substrate, where placement of the first electrode relative to (e.g., within a threshold distance of) the first perimeter edge allows for substantially uniform porosification along the first perimeter edge of the first silicon substrate. The method can include placing of the first electrode relative to (e.g., within a threshold distance of) a second perimeter edge of the first silicon substrate allowing for substantially uniform porosification along the second perimeter edge of the first silicon substrate.

Still another method of forming a porous layer on a silicon substrate is disclosed. The method can include placing a first silicon substrate in a solution, the first silicon substrate positioned between a second and third electrode, where a first electrode surrounds perimeter edges of the first silicon substrate. The method can further include conducting a first current from the second electrode to the third electrode through the first silicon substrate, where placement of the first electrode relative to (e.g., within a threshold distance of) the perimeter edges allows for substantially uniform porosification along the perimeter edges of the first silicon substrate.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 2 illustrates a cross-section of forming a porous layer on a first silicon substrate, according to one embodiment;

FIG. 3 illustrates a cross-section of forming a porous layer on first and second silicon substrates, according to one embodiment;

FIGS. 4-6 are schematic plan views of a first electrode and a first silicon substrate, according to some embodiments;

FIG. 7 illustrates a cross-section of forming a porous layer on a first and second silicon substrate, according to one embodiment;

DETAILED DESCRIPTION

Figure 1:
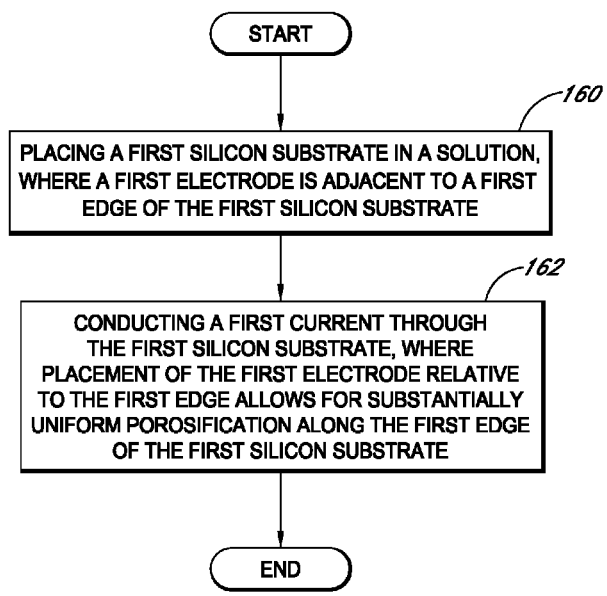
FIG. 1 is a flow chart representation of an example method for forming a porous layer on a silicon substrate, according to some embodiments.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although much of the disclosure is described in terms of silicon substrates and semiconductor devices for ease of understanding, the disclosed techniques and structures apply equally to other semiconductor structures such as silicon wafers and their applications such as in photovoltaic cells or solar cells.

A common problem faced by porosification processes for silicon substrates includes forming uniformly porous layers along the edges. In an example, some porosification techniques can result in higher porosification along the edges as compared to within or on a surface of a silicon substrate. In another example, some porosification techniques can result in lower porosification at the edges as compared to within or on a surface of a silicon substrate. Some techniques can include using circular silicon substrates and removing excess edges to form the desired shape and size of a silicon wafer. Such techniques can be costly and add additional steps to the silicon wafer formation process. To address the above difficulties various techniques are presented for forming a substantially uniform porous layer on a silicon substrate.

FIG. 1 illustrates a flow chart of an embodiment for an example method of forming porous layer on a silicon substrate. In various embodiments, the method of FIG. 1 can include additional (or fewer) blocks than illustrated.

As shown at 160, a silicon substrate can be placed in a solution, where an electrode can be adjacent to and/or within a threshold distance of an edge of the silicon substrate. In an example, an edge can be referred to as a perimeter edge, where edges can refer to perimeter edges. In some embodiments, the silicon substrate can be a non-circular silicon substrate. In other embodiments, the silicon substrates can be square, rectangular, triangular, trapezoidal or of any polygon-type shape. In an example, the silicon substrate can have a thickness approximately in the range of 100 microns-1 millimeter.

In an embodiment, the silicon substrate can be placed in a porosification solution. In some embodiments, the silicon substrate can be placed in a solution composed of a chemical selected from the group consisting of hydrofluoric acid (HF), isopropyl alcohol (IPA) and ethanol. In an embodiment, the solution can include a combination of hydrofluoric acid (HF) and isopropyl alcohol (IPA) or hydrofluoric acid (HF) and ethanol.

In one embodiment, an electrode (e.g., a first electrode) can be positioned relative to an edge of the silicon substrate. Note that the substrate and its edge(s) can similarly be positioned relative to the electrode (e.g., if the electrode is fixed in place). In one embodiment, the electrode can be positioned within a threshold distance, such as 0.5 to 5 millimeters, of an edge, or a first edge, of the silicon substrate. In an embodiment, the electrode can be placed relative to another edge, or a second edge, of the silicon substrate. For example the electrode can be within the same threshold distance range to the second edge as from the first edge. In another embodiment, a different threshold distance can apply for the second edge. For example, a first threshold could be 0.5 to 2 mm and the second threshold could be 1 to 5 mm. If the first and second edges of the silicon substrate are positioned 1 mm and 3 mm, respectively, from the electrode, then both edges are within their respective threshold distances from the electrode.

In an embodiment, the silicon substrate can be positioned between two electrodes. In one embodiment, a second silicon substrate can be placed in the solution. The second silicon substrate can be substantially parallel and non-planar to the first silicon substrate. The second silicon substrate can be placed between the first silicon substrate and one of the electrodes.

In an example, the first and second substrates can be held in a row by a wafer cassette. In one example, multiple silicon substrates can be held in place in a row by a wafer cassette.

At 162, a first current can be conducted through the silicon substrate, where the placement of the first electrode or the substrate (e.g., with edge(s) of the substrate within a threshold distance of the electrode), allows for substantially uniform porosification along the edge of the silicon substrate. In an embodiment, the current density for porosification can be in the range of 0.1-50 mA/cm$^2$. In one embodiment, substantially uniform porosification can be defined as homogenous porosification along the edges and a on the surface of the silicon substrate. The surface of the silicon substrate can be a flat top or a bottom surface surrounded by perimeter edges.

Figure 4:
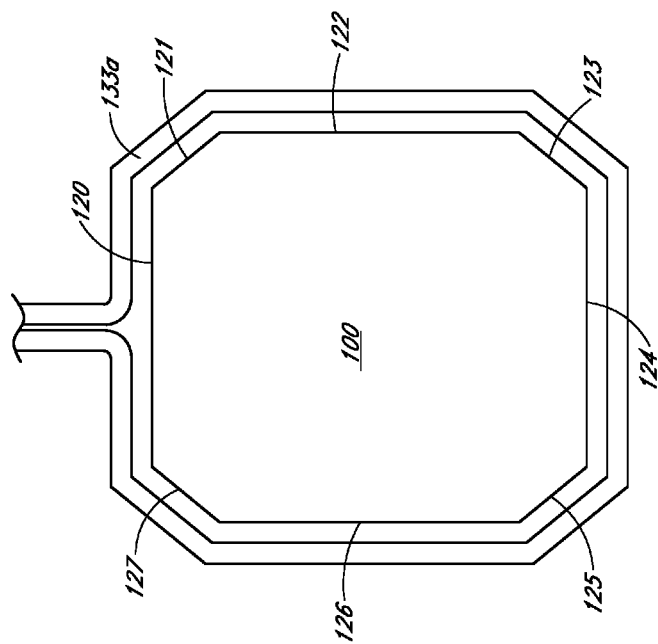

In an embodiment, the first electrode can draw current away from an at least one edge of the silicon substrate. In an embodiment, the first electrode can conduct a second current along the first edge of the first silicon substrate. The second operation 162 can also include the first electrode surrounding the perimeter edges of the first silicon substrate. Note that surrounding may not necessarily include surrounding all of each perimeter edge (e.g., as shown in FIG. 4). Also, in some embodiments (e.g., as shown in FIG. 3), the second electrode 130 can be an anode and the first and third electrodes 133, 132 can be cathodes.

In the above embodiments, the placement of the first electrode relative to the edge(s) can allow for substantially uniform porosification along the edges of the silicon substrate.

With reference to FIG. 2, conducting a first current through a first silicon substrate is shown. Conducting a first current can include conducting a first current 134 through the first silicon substrate 100. As shown in the illustrated embodiment, the first silicon substrate 100 is positioned between a second 130 and third electrode 132. Placement of the first electrode 133 relative to (e.g., within a threshold distance of) perimeter edges 114, 116 of the first silicon substrate 100 can allow for substantially uniform porosification along the perimeter edges 114, 116 resulting in a porous layer 110. In an embodiment, conducting the first current 134 can result in the first electrode 133 drawing current away from the first edge 114, 116 of the first silicon substrate 100.

FIG. 3 continues the example of FIG. 2. As shown, a second silicon substrate 101 can be placed between the first silicon substrate 100 and third electrode 132. The second silicon substrate 101 can be substantially parallel and non-planar to the first silicon substrate 100. In one embodiment, the first current can be conducted through the first and second silicon substrates. Also, the placement of the first electrode 133 allows for substantially uniform porosification along the first edge 114, 116 of both the first silicon substrate 100 and second silicon substrate 101 resulting in uniform porous layers 110, 101 for both the first and second silicon substrates 100, 101. The configuration of FIG. 3 can allow for multiple silicon substrates to be placed between the second electrode 130 and the third electrode 132. The first electrode 133, which can also be referred to as a thief electrode, can allow for the second current 136 to be uniform coming from the first silicon substrate 100. Thus, the method and configuration described allows for the porosification process to be performed on multiple silicon substrates.

Figure 5:
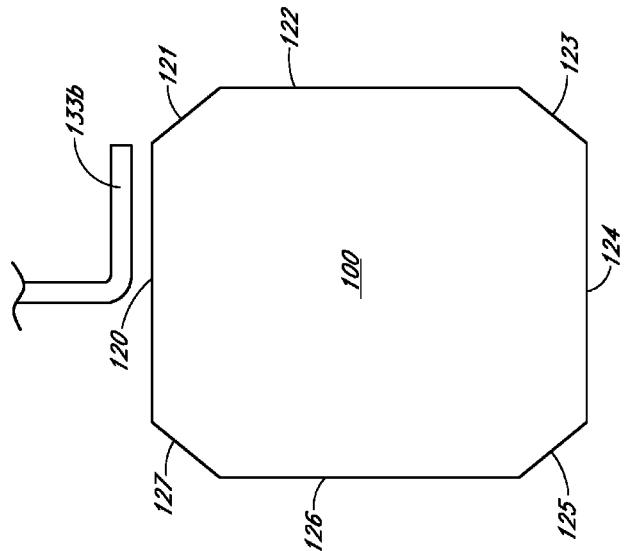

With reference to FIGS. 4-6, a silicon substrate and various placement configurations for a first electrode are illustrated. FIG. 4 shows a configuration of the first electrode 133a in which the electrode can surround multiple edges 120, 121, 122, 123, 124, 125, 126, 127 of the first silicon substrate 100. The placement of the first electrode 133a, or thief electrode, within a threshold distance of the perimeter edges can allow for substantially uniform porosification along the perimeter edges 120, 121, 122, 123, 124, 125, 126, 127 of the first silicon substrate resulting in uniform porous layer around the perimeter edges when conducting a current through the first silicon substrate 100.

In FIG. 5, the first electrode 133b can be within a threshold distance of a first edge 120 of the first silicon substrate 100. Accordingly, placement of the first electrode 133b within the threshold distance of the first edge 120 can allow for substantially uniform porosification along the first edge 120 of the first silicon substrate 100 when conducting a current through the first silicon substrate 100. In an embodiment, placement of the first electrode 133b within a threshold distance (same or different as the threshold distance using for the first edge) of a second edge 121 of the first silicon substrate 100, can further include allowing for substantially uniform porosification along the second edge 121 of the first silicon substrate 100 when conducting a current through the first silicon substrate 100.

FIG. 6 shows another configuration where about half of the surrounding perimeter edges 120, 121, 122, 123 and 124 of the first silicon substrate 100 are located within a threshold distance of the first electrode 133c. Multiple placements and configurations can exist and the method and apparatus are not limited to the described.

FIG. 7 illustrates another embodiment for conducting a first current through a first and second silicon substrate. Similar to that described in FIG. 3, prior to conducting a first current 134, a second silicon substrate 101 can be positioned between the first silicon substrate 100 and third electrode 132. The second silicon substrate 101 can be substantially parallel and non-planar to the first silicon substrate 100. The first current 134 can be conducted through the first and second silicon substrates. In some embodiments, the second current is equal to the first current (e.g., the same or about the same in terms of amperes, same or about the same direction, etc.). In other embodiments, the second current is different than the first current (e.g., different amperes, different direction, etc.) In contrast to FIG. 3, the example of FIG. 7 illustrates placement of the first electrode 133 within a threshold distance to the perimeter edges 114, 116 of both the first and second silicon substrates 100, 101, respectively. For example, the first electrode 133, or thief electrode, can extend across the edges 114, 116 or perimeter edges of both the first and second silicon substrates 100, 101. In another embodiment, multiple thief electrodes can be used such that one or more of the thief electrodes are adjacent to the edges 114, 116 of the first and second silicon substrates 100, 101. Similarly, the first electrode 133 of FIG. 7 can be extended to be adjacent to multiple edges for multiple silicon substrates.

Figure 8:
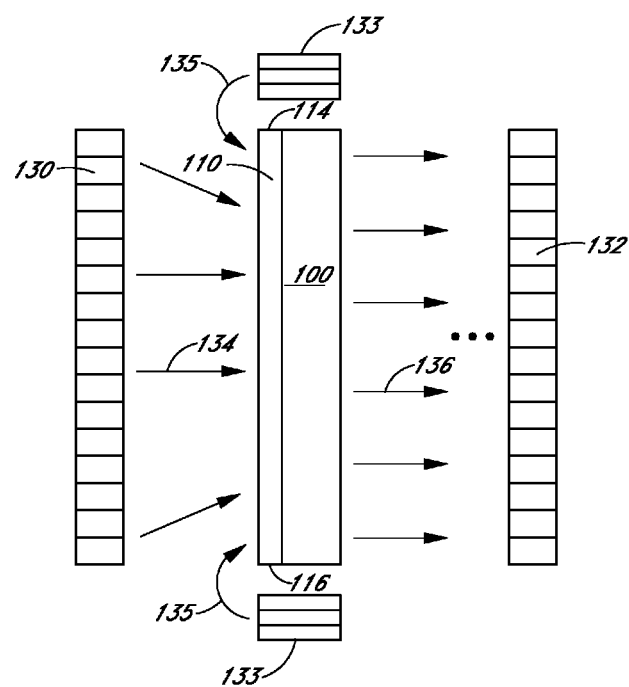
FIG. 8 illustrates a cross-section of forming a porous layer on a first silicon substrate, according to one embodiment.

With reference to FIG. 8, still another embodiment for conducting a first current through a first silicon substrate is shown. Similar to the above, conducting a first current 134 can include conducting a first current 134 through the first silicon substrate 100, the first silicon substrate 100 positioned between a second 130 and third electrode 132, where placement of the first electrode 133 relative to perimeter edges 114, 116 of the first silicon substrate 100 allows for substantially uniform porosification along the first edge 114, 116 of the first silicon substrate 100. As shown, the first electrode 133 can conduct a third current 135 along the first edge 114, 116 of the first silicon substrate 100. In an embodiment, the current can be within +/−10% tolerance of the current applied between the second and third electrodes. The third current can allow for substantially uniform porosification along the first edge 114, 116 of the first silicon substrate 100. Similarly, placement of the first electrode 133 relative to (e.g., within a threshold distance of) a second edge of the first silicon substrate 100 can further include allowing for substantially uniform porosification along the second edge of the first silicon substrate 100 resulting in a uniform porous layer 110. Also, in some embodiments the first and second electrodes 133, 130 can be anodes and the third electrode 132 can be a cathode.

In some embodiments, a second silicon substrate 101 can be positioned between the first silicon substrate 100 and third electrode 132. Similar to that described in FIG. 3, the second silicon substrate 101 can be substantially parallel and non-planar to the first silicon substrate 100. The first current 134 and a second current 136 (which can be equal to the first current) can be conducted through the first and second silicon substrates, respectively. The configuration and method described in FIG. 8 allows for multiple silicon substrates to be placed between the first silicon substrate 100 and the third electrode 132. The first electrode 133 allows for the second current 136 to be uniform coming through the first silicon substrate 100 toward the next silicon substrates, such as a second silicon substrate illustrated in FIG. 3. Thus, the method and configuration described can allow for the porosification process to be performed on multiple silicon substrates.

Figure 9:
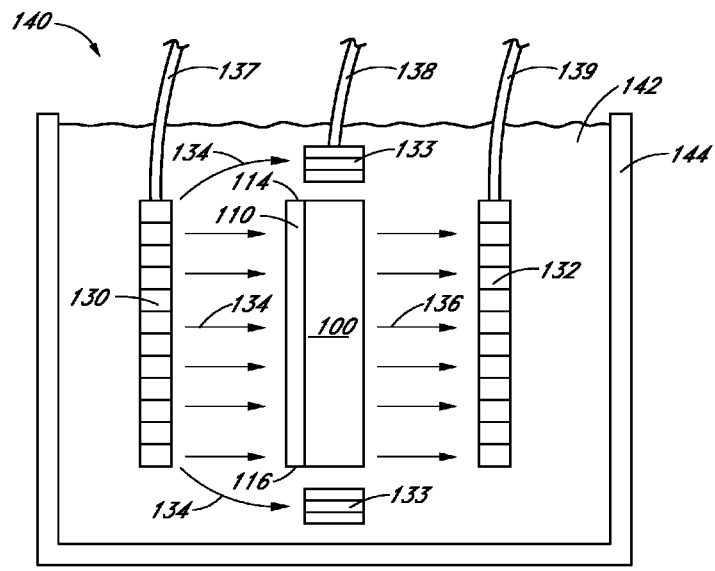
FIG. 9 illustrates a cross-section of a porosification setup in accordance with a method for forming a porous layer on a first silicon substrate, according to one embodiment.

FIG. 9 illustrates another porosification setup. The porosification setup 140 includes a solution 142 (e.g., a porosification solution). The solution can be a chemical, such as hydrofluoric acid (HF), isopropyl alcohol (IPA), ethanol, among other examples. A first connector 138 can hold the first electrode 133 in place and also act as a conduit for current flow. A second connector 137 can hold the second electrode 130 in place, where current can also flow from the second connector 137 to the second electrode 130. Similarly, a third connector 139 can hold the third electrode 132 in place, where and the third connector 139 can also act as a conduit for current flow. A first silicon substrate 100 can be positioned between the second 130 and third electrodes 132, where placement of the first electrode 133 relative to (e.g., within a threshold distance of) a first edge 114, 116 of the first silicon substrate 100 allows for substantially uniform porosification along the first edge 114, 116 of the first silicon substrate 100 as described in the methods above. A porosification tank 144 can enclose and hold the porosification setup.

In an embodiment, multiple silicon substrates can be placed in a porosification tank. In one embodiment, a jig or a planar jig can be used to hold together multiple silicon substrates within the same geometrical plane. In an embodiment, the silicon substrates can be held together by a planar jig. In one example, each silicon substrate in the planar jig can be substantially parallel and planar. In an example, multiple electrodes, such as the first electrode, can be within a threshold distance or distances from the edges of silicon substrates in the planar jig. In the process of conducting a first current through the silicon substrates held by a planar jig, the electrodes allow substantially uniform porosification along the edges of the silicon substrates. In another embodiment, multiple silicon substrates can be held together in a row, such as in a cassette. In one example, each silicon substrate in the cassette is substantially parallel and non-planar. In an example, a first electrode can be within a threshold distance from the edges of the first silicon substrate. Upon conducting a first current through the silicon substrates in the cassette, the first electrode can allow substantially uniform porosification along the edges of the silicon substrates. Various combinations of batch processing for multiple silicon substrates can be used, where the applications mentioned should not be construed as limiting, and where other techniques for processing multiple silicon substrates can also be applied.

Figure 10:
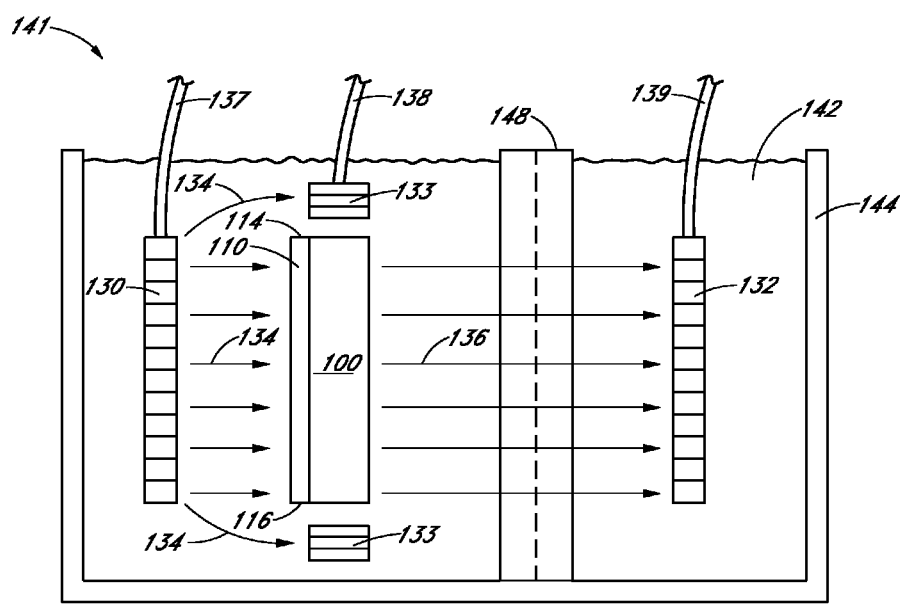
FIG. 10 illustrates a cross-section of another porosification setup in accordance with a method for forming a porous layer on a first silicon substrate, according to one embodiment.
Figure 11:
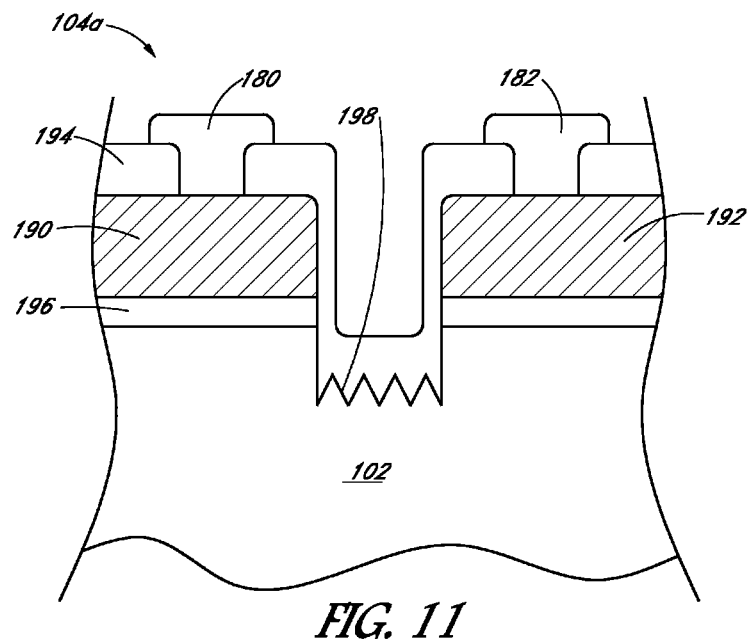
FIG. 11 illustrates a cross-section of an example solar cell fabricated according to the disclosed techniques for porosification.

With reference to FIG. 10, another porosification setup is shown. The porosification setup 141 also includes a solution 142 or a porosification solution similar to that discussed in FIG. 9. A first connector 138 can hold the first electrode 133 in place and also act as a conduit for current flow. A second connector 137 can hold the second electrode 130 in place, where current can flow from the second connector 137 to the second electrode 130. Similarly, a third connector 139 can hold the third electrode 132 in place, where and the third connector 139 can also act as a conduit for current flow. A first silicon substrate 100 can be positioned between a second 130 and third electrode 132, where placement of the first electrode 133 relative to a first edge 114, 116 of the first silicon substrate 100 allows for substantially uniform porosification along the first edge 114, 116 of the first silicon substrate 100 as described in the methods above. A porosification tank 144 can enclose and hold the porosification setup. In contrast to FIG. 9, a cationic membrane 148 can separate the third electrode 132 from the first silicon substrate 100, first electrode 133 and second electrode 130. The cationic membrane 148 can provide physical separation between separate regions of the porosification tank 144. The second current 136, which can be equal to the first current 134, can still pass through to the third electrode 132 through the cationic membrane 148. In another embodiment the cationic membrane can be placed between the second electrode 130 and the first silicon substrate 100. In still another embodiment, the cationic membrane can separate the first electrode 133 from the porosification solution 142, surrounding the first electrode 133 while allowing for current to be drawn to or conducted by the first electrode 133. In yet another embodiment, multiple cationic membranes can be used to separate multiple silicon substrates used in the porosification setup 141. Similar to FIG. 11 illustrates an example solar cell that is fabricated by using the disclosed porous layer on a silicon substrate described above. After forming the porous layer, an epi-silicon layer can be formed over the porous layer. In one embodiment, the porous layer can be in the range of 1-10 microns. In an embodiment, the epi-silicon layer can be in the range of 10-150 microns. After forming the epi-silicon layer, the epi-silicon layer can be removed from the porous layer and silicon substrate, resulting in a silicon wafer 102. The silicon wafer 102 can be cleaned and etched in preparation for subsequent fabrication process, such as a solar cell fabrication process.

For example, for the example solar cell of FIG. 11, a first doped region 190 and a second doped region 192 can be formed through a thermal process on the silicon wafer 102. In another embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is composed of silicon nitride (SiN). A second dielectric layer 196 can be formed over the silicon wafer 102 prior to forming the first and second doped regions 190, 192. In an embodiment, the second dielectric layer 196 is composed of a tunnel oxide. In another embodiment, both the first and second doped regions 190, 192 include diffusion regions in an interdigitated pattern. In an embodiment, the first and second doped regions are instead first and second doped polysilicon regions.

In one embodiment, a trench region 198 can be formed to separate both the first and second doped regions 190, 192, which can reduce recombination at the interface. In an embodiment, the trench region 198 includes a textured surface for additional collection of light from the back side of the solar cell 104a. A plurality of contact holes can be formed through the first dielectric layer 194 and on the first and second doped regions 190, 192. Contact holes can be formed through a chemical etch, ablation or any industry standard lithography process. An electroplating process can be performed to form a first and second plurality of interdigitated metal contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 104a for increased solar radiation collection. A texturized region is one which has a regular or an irregular shaped surface for scattering incoming light, decreasing the amount of light reflected back of the surface of the solar cell 104a. In another embodiment, a third dielectric layer can be formed on the texturized region on the front side of the solar cell 104a. In one embodiment, the third dielectric layer is composed of silicon nitride (SiN). In some embodiments, the first 194 and third dielectric layers are anti-reflective layers.

Figure 12:
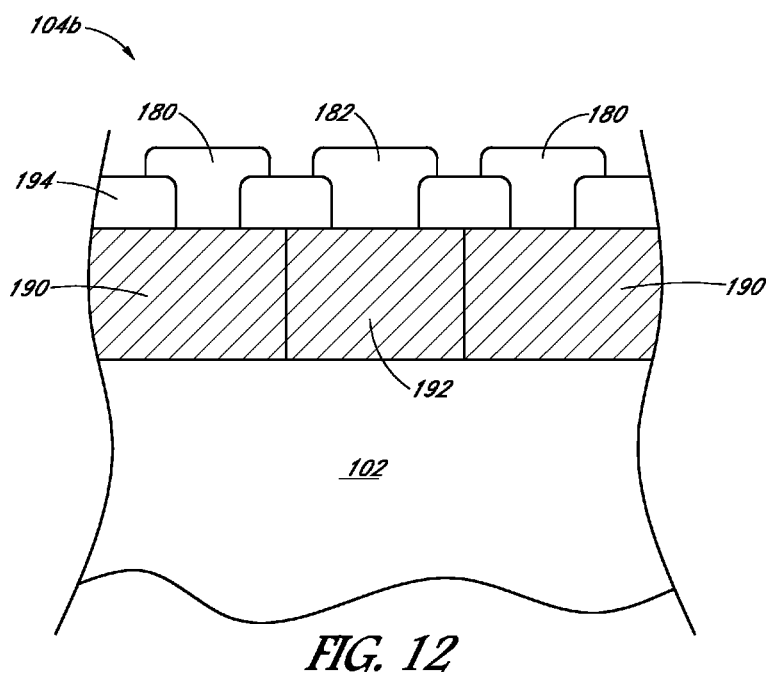
FIG. 12 illustrates a cross-section of another example solar cell fabricated according to the disclosed techniques for porosification.

Turning now to FIG. 12, an example solar cell that is fabricated using the disclosed porous layer on a silicon substrate above is shown. Similar to that described in FIG. 11, an epi-silicon layer can be formed over the porous layer. In one embodiment, the porous layer can be approximately in the range of 1-10 microns. In an embodiment, the epi-silicon layer can be approximately in the range of 10-150 microns. After forming the epi-silicon layer, the epi-silicon layer is removed from the porous layer and silicon substrate, resulting in a silicon wafer 102. The silicon wafer 102 can be cleaned and etched in preparation for subsequent fabrication process, such as a solar cell fabrication process.

In an example solar cell fabrication process, a first doped region 190 and a second doped region 192 can be formed through a thermal process on the silicon wafer 102. In another embodiment, the first and second doped regions 190, 192, each include a doping material but is not limited to a positive-type dopant such as boron or a negative-type dopant such as phosphorous. A first dielectric layer 194 can be formed on the first and second doped regions 190, 192. In an embodiment, the first dielectric layer 194 is composed of silicon nitride (SiN). A second dielectric layer can be formed over the silicon wafer 102 prior to forming the first and second doped regions 190, 192. In an embodiment, the second dielectric layer is composed of a tunnel oxide. In another embodiment, both the first and second doped regions 190, 192 include diffusion regions in an interdigitated pattern. In one embodiment, a plurality of contact holes can be formed through the first dielectric layer 194 and on the first and second doped regions 190, 192. Contact holes can be formed through a chemical etch, ablation or any industry standard lithography process. An electroplating process can be performed to form a first and second plurality of interdigitated metal contact fingers 180, 182, where the first and second plurality of interdigitated metal contact fingers 180, 182, are electrically coupled to the contact holes through the first dielectric layer 194 on the first and second doped regions 190, 192 respectively. In an embodiment, a texturized region can be formed on the front side of the solar cell 104b for increased solar radiation collection. A texturized region is one which has a regular or an irregular shaped surface for scattering incoming light, decreasing the amount of light reflected back of the surface of the solar cell 104b. In one embodiment, a third dielectric layer can be formed on the texturized region on the front side of the solar cell 104b. In another embodiment, the third dielectric layer is composed of silicon nitride (SiN). In yet another embodiment, the first 194 and third dielectric layers are anti-reflective layers.

It should be appreciated that the various tasks performed in connection with forming a porous layer on a silicon substrate and subsequently a solar cell manufacturing process can include any number of additional or alternative tasks. The tasks shown in FIG. 1-12 need not be performed in the illustrated order, and additional steps may be incorporated into a more comprehensive procedure or process having additional functionality not described in detail herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for forming a porous layer on a silicon substrate, the method comprising: placing a first silicon substrate in a solution, wherein a first electrode is within a threshold distance of a first edge of the first silicon substrate; and conducting a first current through the first silicon substrate, wherein the first electrode's position being within the threshold distance of the first edge allows for substantially uniform porosification along the first edge of the first silicon substrate, wherein said conducting results in the first electrode drawing current away from the first edge of the first silicon substrate.

2. The method of claim 1 wherein the first electrode's position being within a second threshold distance of a second edge of the first silicon substrate allows for substantially uniform porosification along the second edge of the first silicon substrate.

3. A method for forming a porous layer on a silicon substrate, the method comprising: placing a first silicon substrate in a solution, wherein a first electrode is within a threshold distance of a first edge of the first silicon substrate; and conducting a first current through the first silicon substrate, wherein the first electrode's position being within the threshold distance of the first edge allows for substantially uniform porosification along the first edge of the first silicon substrate, further comprising the first electrode conducting a second current along the first edge of the first silicon substrate.

4. A method for forming a porous layer on a silicon substrate, the method comprising: placing a first silicon substrate in a solution, wherein a first electrode is within a threshold distance of a first edge of the first silicon substrate; and conducting a first current through the first silicon substrate, wherein the first electrode's position being within the threshold distance of the first edge allows for substantially uniform porosification along the first edge of the first silicon substrate, wherein the first electrode at least partially surrounds perimeter edges of the first silicon substrate, wherein the first electrode's position relative to the perimeter edges allows for substantially uniform porosification along the perimeter edges.

5. The method of claim 1, wherein placing a first silicon substrate in the solution comprises placing a non-circular silicon substrate in the solution.

6. The method of claim 1, wherein placing the first silicon substrate in the solution comprises placing the first silicon substrate in a porosification solution.

7. The method of claim 1, wherein placing the first silicon substrate in a solution comprises placing the first silicon substrate in a solution comprised of a chemical selected from the group consisting of hydrofluoric acid (HF), isopropyl alcohol (IPA) and ethanol.

8. The method of claim 1 further comprising:
placing a second silicon substrate in the solution, the second silicon substrate substantially parallel and non-planar to the first silicon substrate; and
wherein conducting the first current includes conducting the first current through the first and second silicon substrates, wherein placement of the first electrode allows for substantially uniform porosification along the first edge of both the first and second silicon substrates.

9. The method of claim 8 wherein placement of the first electrode allows for substantially uniform porosification along a second edge of both the first and second silicon substrates.

10. A method of forming a porous layer on a silicon substrate, the method comprising:
    placing a first silicon substrate in a solution, the first silicon substrate positioned between a second and third electrode, wherein a first electrode is positioned along a first perimeter edge of the first silicon substrate; and
    conducting a first current from the second electrode to the third electrode through the first silicon substrate, wherein placement of the first electrode relative to the first perimeter edge allows for substantially uniform porosification along the first perimeter edge of the first silicon substrate.

11. The method of claim 10, wherein placement of the first electrode relative to a second perimeter edge of the first silicon substrate allows for substantially uniform porosification along the second perimeter edge of the first silicon substrate.

12. The method of claim 10 further comprising:
    placing a second silicon substrate between the first silicon substrate and the third electrode, the second silicon substrate substantially parallel and non-planar to the first silicon substrate; and
    wherein conducting the first current includes conducting the first current through the first and second silicon substrates, the placement of the first electrode allowing for substantially uniform porosification along the respective first perimeter edge of both the first and second silicon substrates.

13. The method of claim 10, wherein placement of the first electrode is within first and seconde threshold distances relative to respective first perimeter edges of the first and second silicon substrates, respectively, allowing for substantially uniform porosification along both the first perimeter edges of the first and second silicon substrates.

14. The method of claim 13, wherein the first threshold distance is different than the second threshold distance.

15. The method of claim 10, further comprising the first electrode conducting a second current along the first perimeter edge of the first silicon substrate.

16. A method of forming a porous layer on a silicon substrate, the method comprising:
    placing a first silicon substrate in a solution, the first silicon substrate positioned between a second and third electrode, wherein a first electrode is physically separated from the solution by a cationic membrane and at least partially surrounds perimeter edges of the first silicon substrate; and
    conducting a first current from the second electrode to the third electrode through the first silicon substrate, wherein placement of the first electrode relative to the perimeter edges allows for substantially uniform porosification along the perimeter edges of the first silicon substrate.

17. The method of claim 16 further comprising:
    placing a second silicon substrate between the first silicon substrate and the third electrode, the second silicon substrate substantially parallel and non-planar to the first silicon substrate, wherein the cationic membrane physically separates the first silicon substrate from second silicon substrate; and
    conducting a first current from the second electrode to the third electrode through the first and second silicon substrates, wherein placement of the first electrode relative to the perimeter edges of the first silicon substrate allows for substantially uniform porosification along the perimeter edges of the first and second silicon substrates.

18. The method of claim 16, wherein said conducting results in the first electrode drawing current away from the perimeter edges of the silicon substrate.

19. The method of claim 16, further comprising the first electrode conducting a second current along the perimeter edges of the first silicon substrate.

* * * * *